United States Patent
Hsu

(10) Patent No.: US 8,213,186 B2
(45) Date of Patent: Jul. 3, 2012

(54) RETAINING ASSEMBLY AND APPARATUS USING THE SAME

(75) Inventor: Shih-Lung Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 204 days.

(21) Appl. No.: 12/770,781

(22) Filed: Apr. 30, 2010

(65) Prior Publication Data

US 2011/0032682 A1 Feb. 10, 2011

(30) Foreign Application Priority Data

Aug. 7, 2009 (CN) .......................... 2009 1 0305380

(51) Int. Cl.
*H05K 7/14* (2006.01)
*H05K 7/18* (2006.01)
(52) U.S. Cl. .................. 361/799; 361/807; 361/810
(58) Field of Classification Search .................. 361/807, 361/810, 799, 759, 801–803, 748
See application file for complete search history.

(56) References Cited

U.S. PATENT DOCUMENTS

| | | | | |
|---|---|---|---|---|
| 5,281,149 A | * | 1/1994 | Petri | 439/66 |
| 5,452,184 A | * | 9/1995 | Scholder et al. | 361/799 |
| 7,477,528 B2 | * | 1/2009 | Kim | 361/825 |
| 7,940,532 B2 | * | 5/2011 | Willing et al. | 361/807 |

FOREIGN PATENT DOCUMENTS

| | | |
|---|---|---|
| TW | 200535594 A | 11/2005 |
| TW | 200930245 A | 7/2009 |

* cited by examiner

*Primary Examiner* — Hung S Bui
(74) *Attorney, Agent, or Firm* — Altis Law Group, Inc.

(57) ABSTRACT

A retaining assembly for retaining a first member with a second member is provided. The retaining assembly is capable of retaining the first member. The retaining assembly includes a body and at least one retaining device retained to the body. Each retaining device includes a supporting member and a latching member corresponding to the supporting member. The supporting member and the latching member cooperatively define a space for receiving the second member, and further cooperatively secure the member after the member is retained in space. An apparatus using the retaining assembly are also provided.

18 Claims, 9 Drawing Sheets

RETAINING ASSEMBLY AND APPARATUS USING THE SAME

BACKGROUND

1. Technical Field

The present disclosure relates to retaining assemblies.

2. Description of Related Art

A printed circuit board is generally fixed to a housing of an apparatus by a plurality of fixing members, such as bolts or screws. However, it takes a lot of time to assemble the printed circuit board to the housing of the apparatus via the bolts or screws.

Therefore, it is desired to provide a retaining assembly being applied to an apparatus for overcoming or alleviating the described shortcomings and deficiencies.

BRIEF DESCRIPTION OF THE DRAWINGS

The components of the drawings are not necessarily drawn to scale, the emphasis instead being placed upon clearly illustrating the principles of the embodiments of a retaining assembly, an apparatus using the same. Moreover, in the drawings, like reference numerals designate corresponding parts throughout several views.

DETAILED DESCRIPTION

Figure 1:
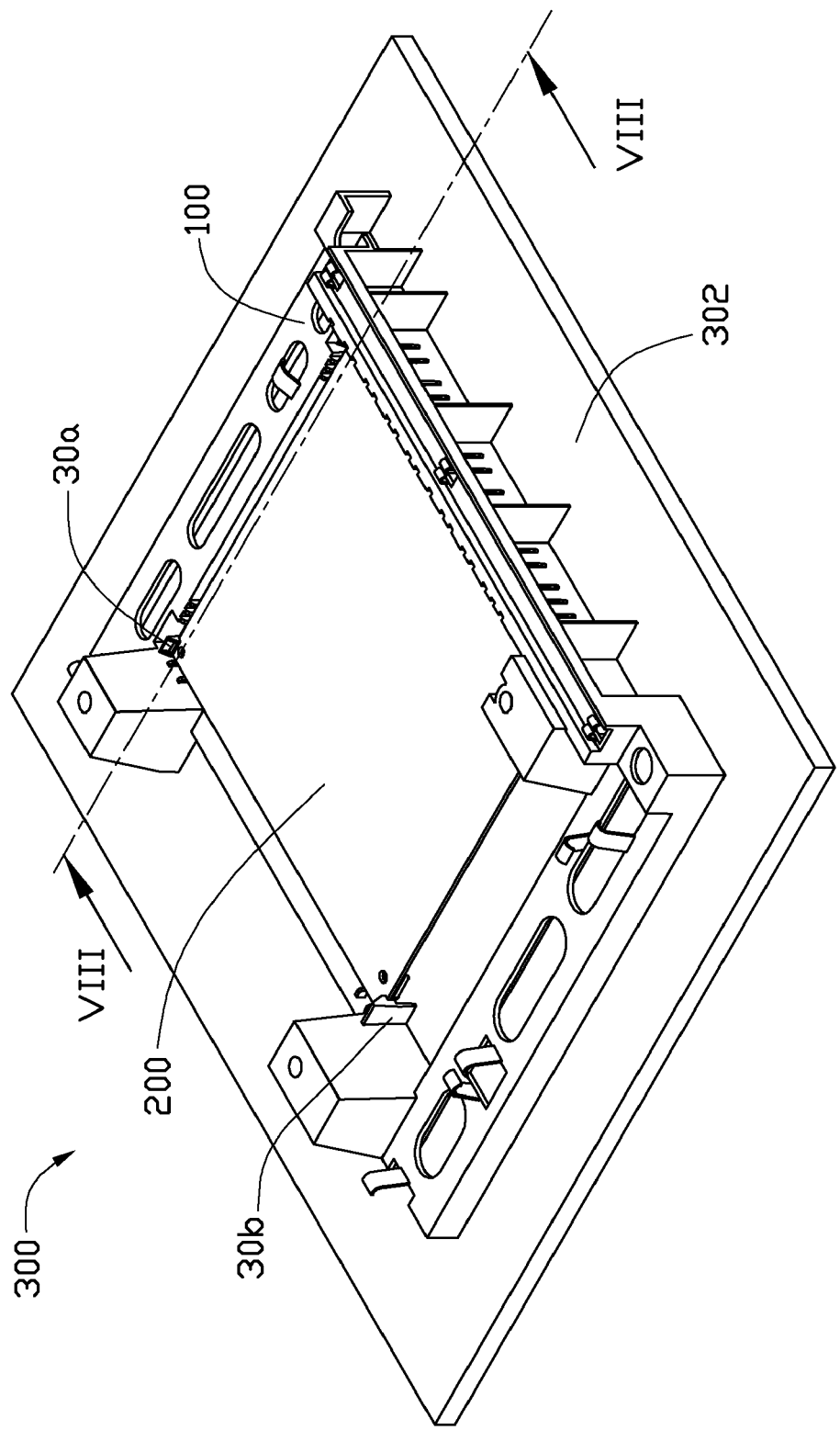
FIG. 1 is a perspective view of an apparatus having a retaining assembly in accordance with one embodiment.

Referring to FIG. 1, an apparatus 300 such as a part of a display panel in accordance with an embodiment is shown. The apparatus 300 includes a first member 302, a retaining assembly 100, and a second member 200. In the embodiment, the first member 302 is a housing of a display panel, while the second member 200 is a printed circuit board for the display panel. The retaining assembly 100 is used to retain the printed circuit board 200 to the housing 302, and is configured to electrically connect the printed circuit board 200 to the housing 302.

Figure 2:
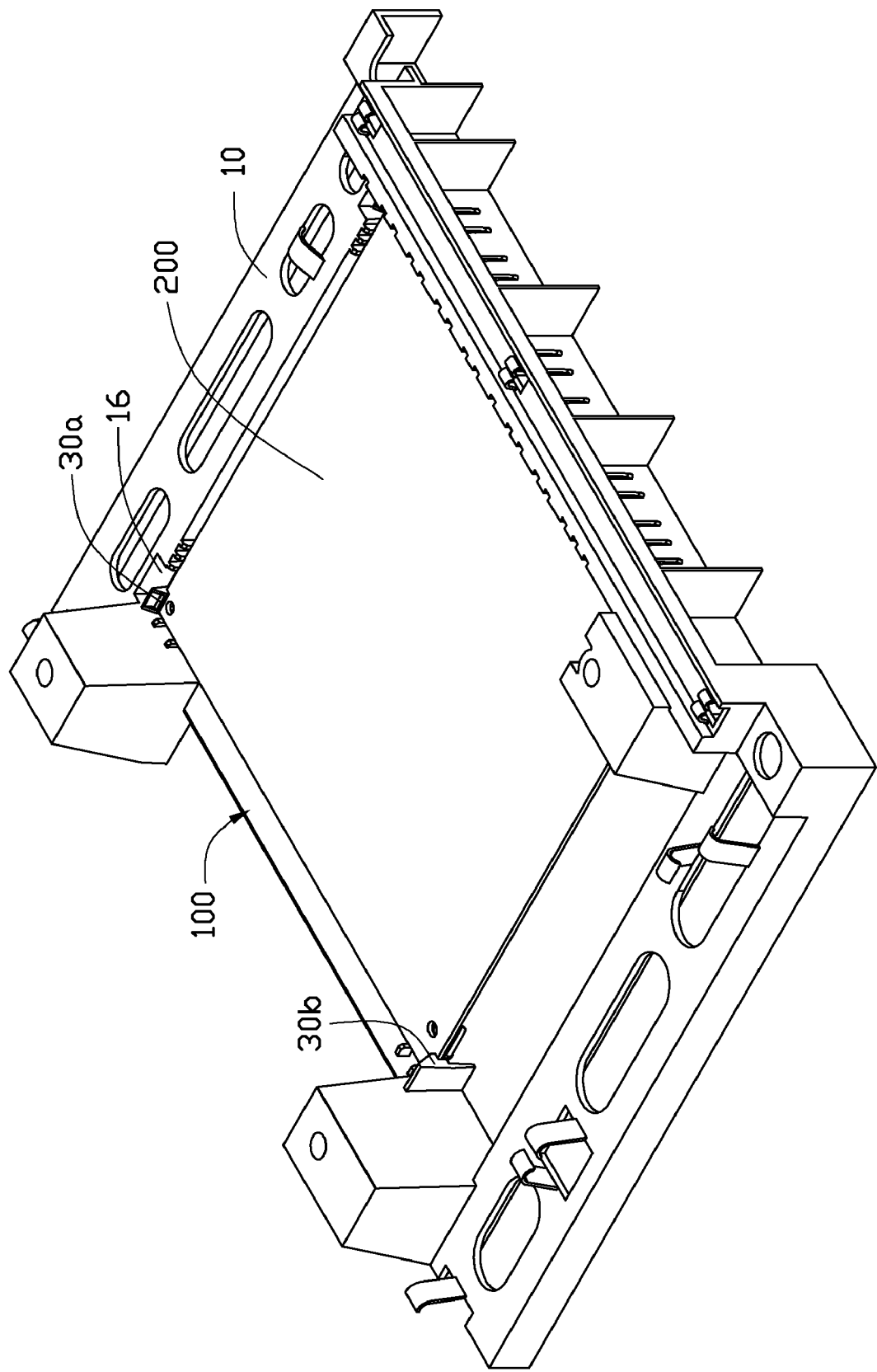
FIG. 2 is a partial perspective view of the apparatus shown in FIG. 1.
Figure 3:
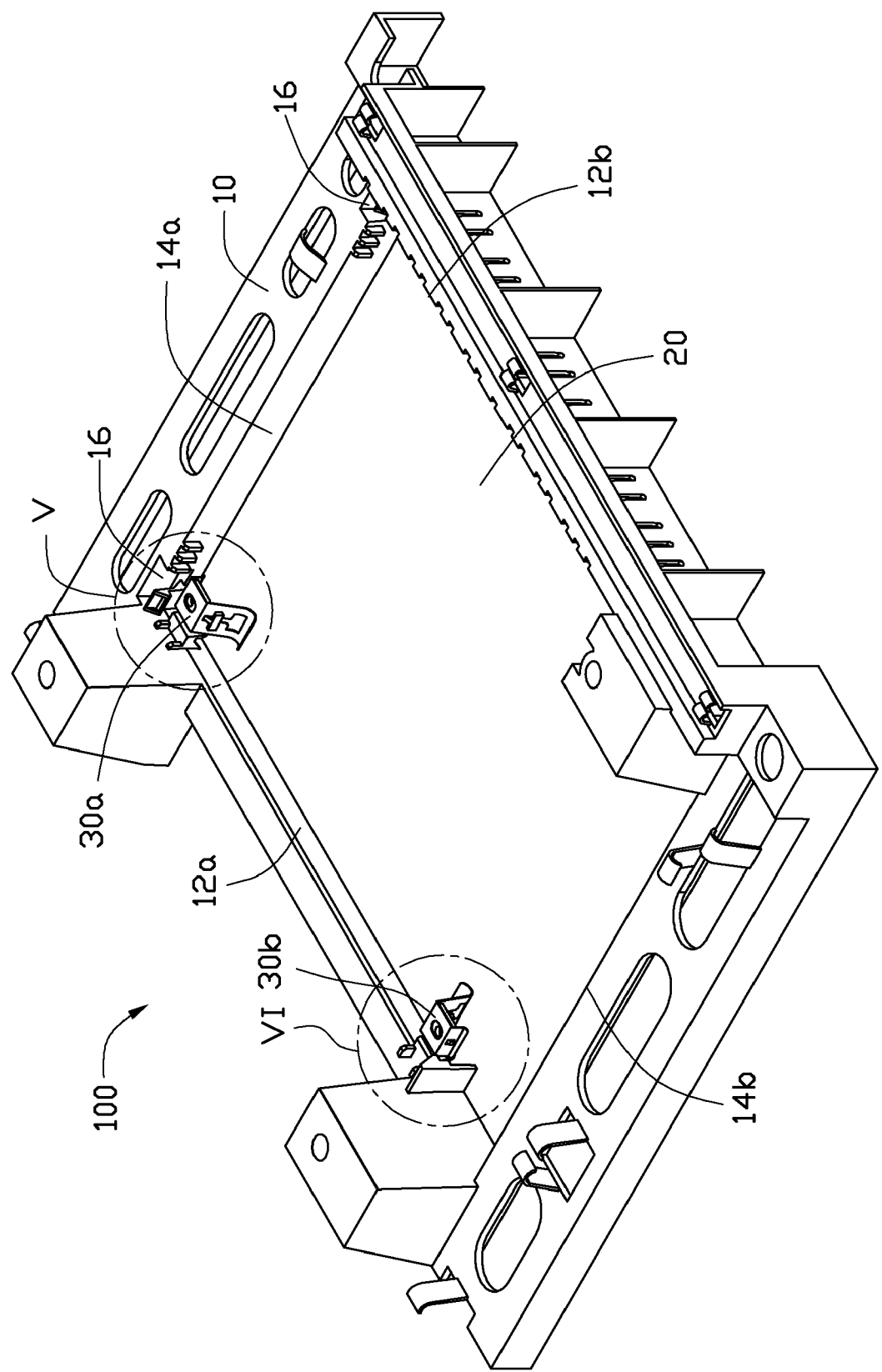
FIG. 3 is a perspective view of the retaining assembly of FIG. 1.
Figure 4:
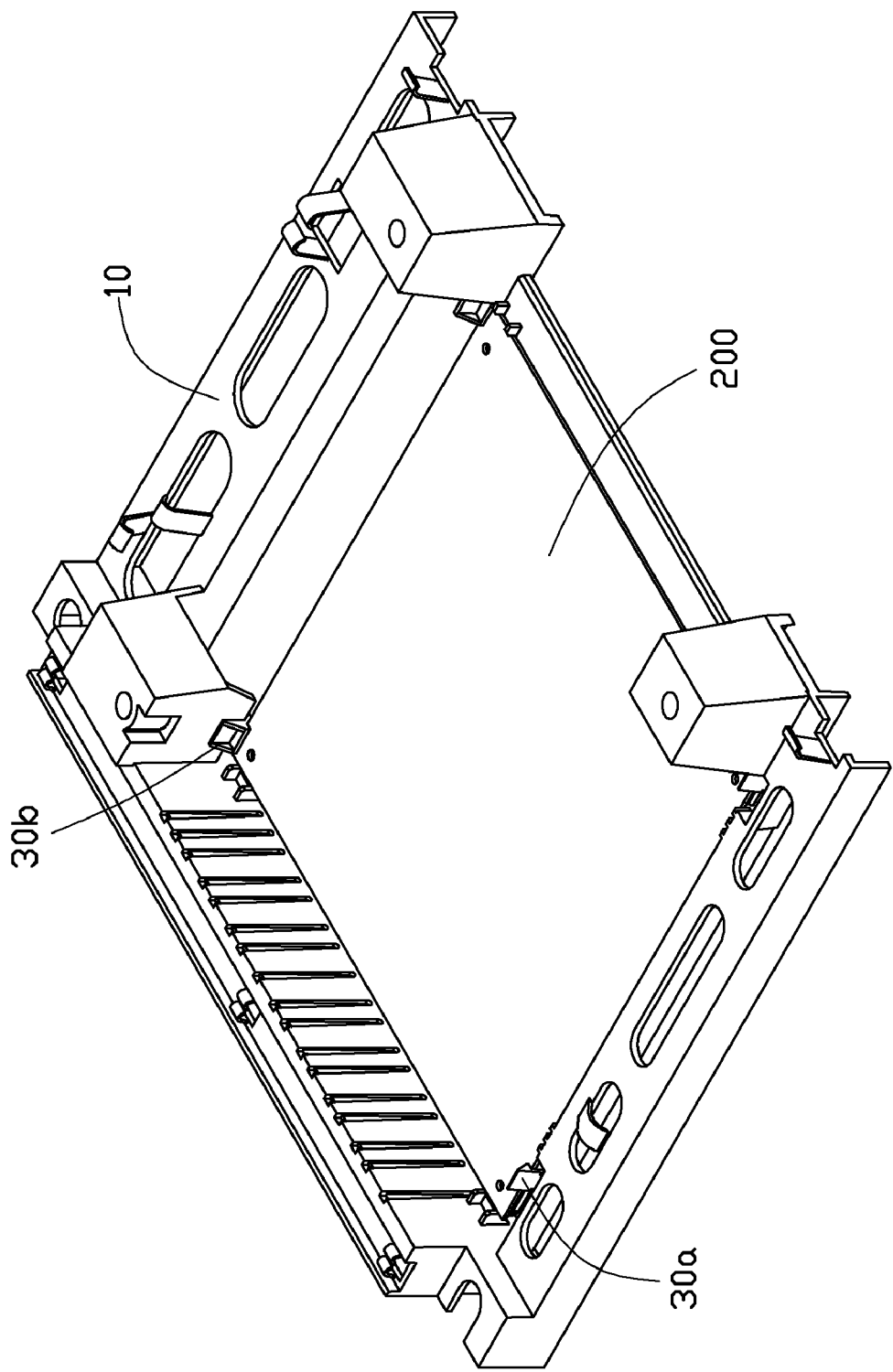
FIG. 4 is similar to FIG. 2, but viewed from another aspect.

Referring to FIGS. 2-4, the retaining assembly 100 may be substantially rectangular. The fixing assembly 100 includes a body 10, which may be made of plastic. The body 10 includes four sidewalls. The first sidewall 12a, the fourth sidewall 14b, the second sidewall 12b, and the third sidewall 14a, are serially interconnected with each other to define an opening 20. The shape of the opening 20 corresponds with the shape of the printed circuit board 200 for accommodation of the printed circuit board 200.

The third sidewall 14a includes two opposite ends, and each of the two opposite ends defines a notch 16. The two notches 16 are adjacent to the first and second sidewalls 12a and 12b respectively. The two notches 16 communicate with the opening 20 and face the fourth sidewall 14b.

The retaining assembly 100 further includes two first positioning devices 30a and two second positioning devices 30b. The first and second positioning devices 30a, 30b are configured to retain the printed circuit board 200 to the retaining assembly 100.

One of the first positioning devices 30a and one of the second positioning devices 30b are attached to opposite ends of the first sidewall 12a. The other first positioning device 30a and the other second positioning potion 30b are attached to the second sidewall 12b opposite to the first sidewall 12a. The two first positioning devices 30a may be arranged symmetrically and substantially adjacent to the third sidewall 14a. The two first positioning devices 30a are corresponding to the notches 16 respectively. The two second positioning devices 30b may be arranged symmetrically and substantially adjacent to the fourth sidewall 14b. The first and second positioning devices 30a and 30b cooperatively define a contour (not labeled) to match with the printed circuit board 200, such that the printed circuit board 200 is retained to the retaining assembly 100 by the first and second positioning devices 30a and 30b. In the embodiment, the first and second positioning devices 30a and 30b are arranged to correspond with four corners of the printed circuit board 200 respectively.

The function and structure of the first and second positioning devices 30a and 30b may be the same. The distance between the second positioning devices 30b and the fourth sidewall 14b is larger than that of the first positioning devices 30a and the third sidewall 14a. In the following description, for simplicity, the first positioning device 30a attached to the first sidewall 12a is only selected to be described in detail.

Figure 7:
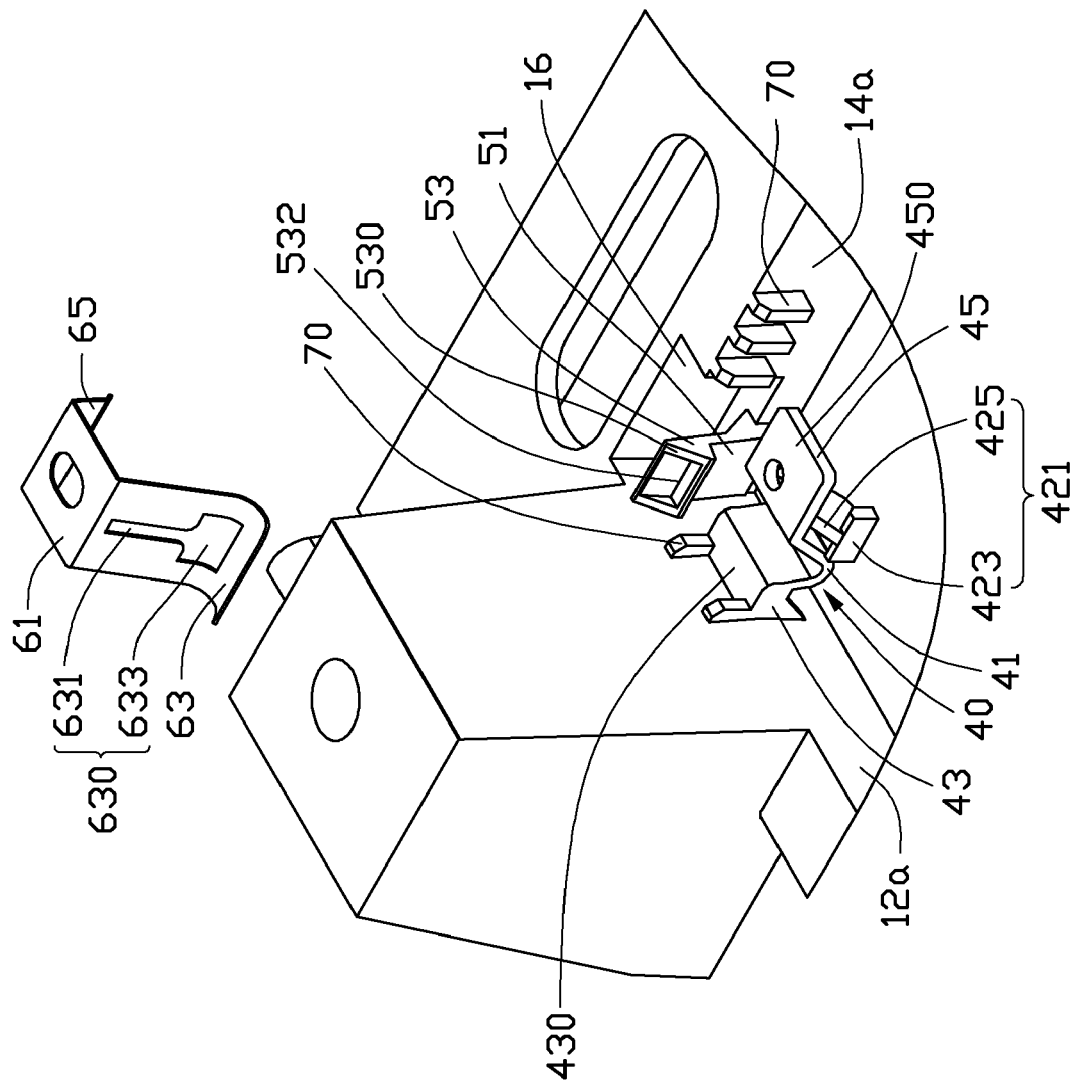
FIG. 7 is an enlarged disassembled view in correspondence with the enlarged view shown in FIG. 4.

Referring to FIGS. 4 and 7, the first positioning device 30a includes a supporting member 40, a latching member 50, and an elastic sheet 60 mounted on the supporting member 40. The supporting member 40 is fixed to the first sidewall 12a and extends laterally. The latching member 50 is further attached to the third sidewall 14a and extends upwardly. The latching member 50 is corresponding to the notch 16 such that there is room for the latching member 50 to be deflected outwardly. In the embodiment, the latching member 50 may be a hook extending upwardly from the body 10 integrally, while the supporting member 40 may be a supporting arm. One end of the elastic sheet 60 is disposed upon the supporting member 40, and the other end of the elastic sheet 60 is electrically contacted with an inner surface of housing 302, which acts as a grounding zone for the printed circuit board 200.

The supporting member 40 may include a connecting portion 43, a supporting portion 45, and a curved portion 41. The curved portion 41 is used to increase the flexibility of the supporting member 40 and may be substantially U-shaped. The supporting portion 45 may be substantially plate-like and is coupled to the connecting portion 43 via the curved portion 41 such that the supporting portion 45 can be moved upward and downward relative to the connecting portion 43. When the curved portion 41 is in an original state, the top surface 430 of the connecting portion 43 and a top surface 450 of the supporting portion 45 are aligned on a plane (not labeled).

A restricting portion 421 is fixed to a surface of the supporting portion 45 opposite to the top surface 450. The restricting portion 421 includes a stopping block 423 and a connecting block 425. The stopping block 423 may be substantially perpendicular to the first sidewall 12a, and may be substantially parallel to the third sidewall 14a. The stopping block 423 is fixed to the supporting portion 45 via the connecting block 425.

Figure 6:
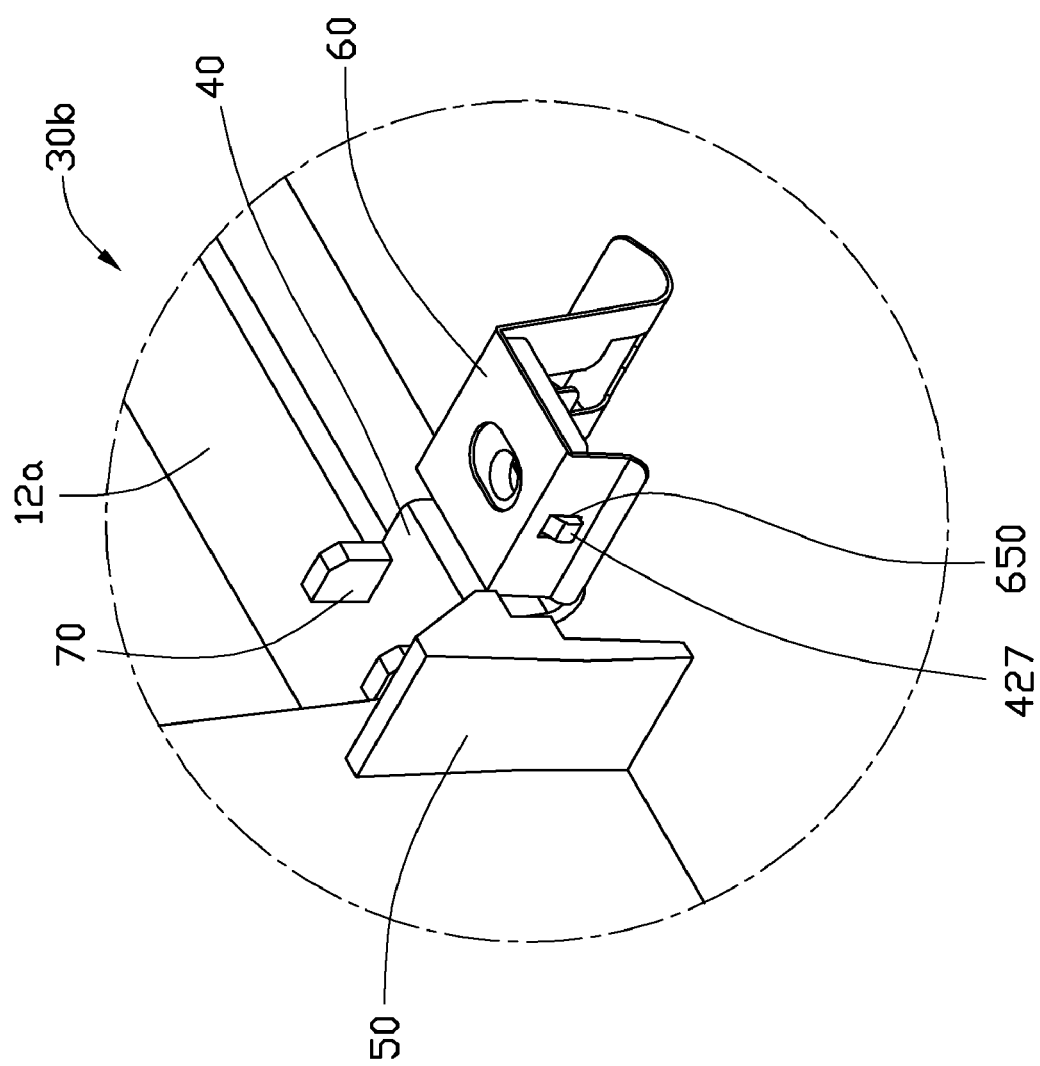
FIG. 6 is an enlarged view of V part of the retaining assembly of FIG. 3.

Furthermore, a protrusion 427 (see FIG. 6) protrudes from a side surface of the supporting portion 45 adjacent to the notch 16. The protrusion 427 may cooperate with the restricting portion 421 to restrict the elastic sheet 60 to the supporting member 40.

The latching member 50 includes a retaining block 51 extending upward from the body 10. An end of the retaining block 51 is attached to the third sidewall 14a. The other end of the retaining block 51 corresponds to the notch 16, and can be moved. In the embodiment, the retaining block 51 is an elastic element. A protruding block 53 protrudes from the other end of the retaining block 51. The protruding block 53 is opposite to the notch 16 and extends in a direction substantially perpendicular to the third sidewall 14a, and is arranged over the supporting member 40. The protruding block 53 and the plane that the surface 430 and the upper surface 450 are aligned on, cooperatively define a clearance (not labeled). The width of the clearance is slightly less than the thickness of the printed circuit board 200, thus, the printed circuit board 200 is capable of being clamped to the clearance. Therefore, the first and second retaining devices 30a and 30b cooperatively define a space (not labeled) for receiving the printed circuit board 200, such that the printed circuit board 200 is retained to the retaining assembly 100.

The protruding block 53 further defines an inclined surface 530 for guiding the printed circuit board 200. The inclined surface 530 further defines a recess 532 for receiving a tool for disassembling the printed circuit board 200. When an external force in a direction perpendicular to the retaining block 51 is provided to press the protruding block 53 downward at the inclined surface 530, the latching member 50 elastically deforms outward and rebounds inward as the protruding block 53 is moved over to retain the printed circuit board 200. As a result, the printed circuit board 200 is capable of latching to the retaining assembly 100.

Figure 5:
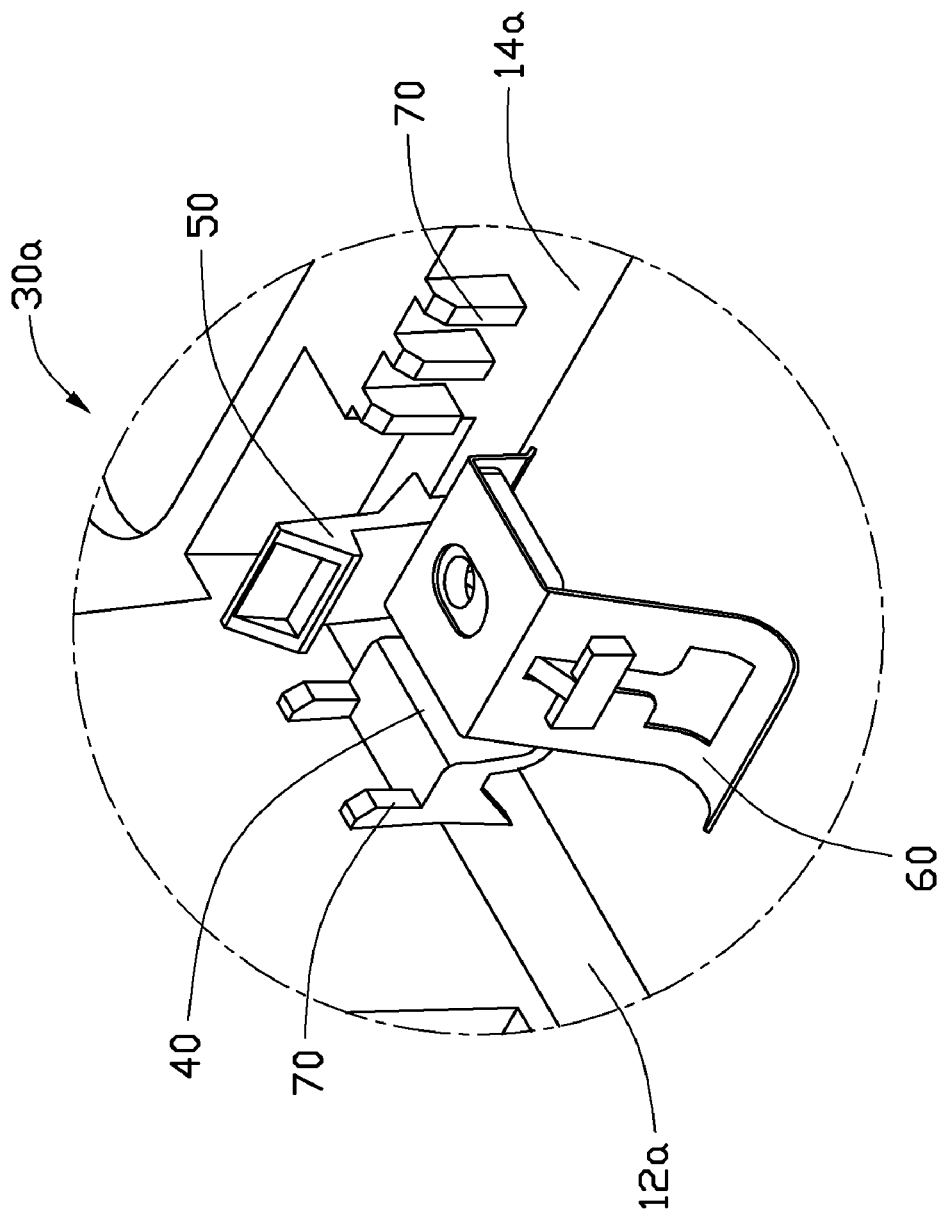
FIG. 5 is an enlarged view of IV part of the retaining assembly of FIG. 3.

The elastic sheet 60 may be made of metal, such as aluminum, and includes a top portion 61, a contacting portion 63, and a positioning portion 65. The contacting portion 63 and the positioning portion 65 protrude from opposite ends of the top portion 61 respectively, and are arranged on the same side of the top portion 61. The contacting portion 63 defines a first through hole 630. The first through hole 630 includes a wide portion 633 and a narrow portion 631. The size of the wide portion 633 is larger than that of the stopping block 423 of the restricting portion 421, such that the stopping block 423 is able to pass through the wide portion 633. The narrow portion 631 of the first through hole 630 is configured to receive the connecting block 425 of the restricting portion 421 for restricting the stopping block 423. Referring further to FIG. 5, the positioning portion 65 defines a second through hole 650. The second through hole 650 receives the protrusion 427 of the supporting portion 45.

In assembly, the stopping block 423 of the supporting member 40 is first passed through the wide portion 633 of the first through hole 630 of the elastic sheet 60, and the connecting block 425 is received in the narrow portion 631 of the first through hole 630. The connecting member 425 of the supporting member 40 slides along the narrow portion 631 to an end thereof opposite to the wide portion 633 of the elastic sheet 60, thus, the narrow portion 631 restricts the stopping block 423. The positioning portion 65 of the elastic sheet 60 is then driven to elastically deform, such that the protrusion 427 of the supporting member 40 is received in the second through hole 650 of the elastic sheet 60. As a result, the elastic sheet 60 is mounted to the supporting member 40, and the end of the contacting portion 63 opposite to the top portion 61 electrically contacts with the housing 302 of the display panel 300.

Figure 8:
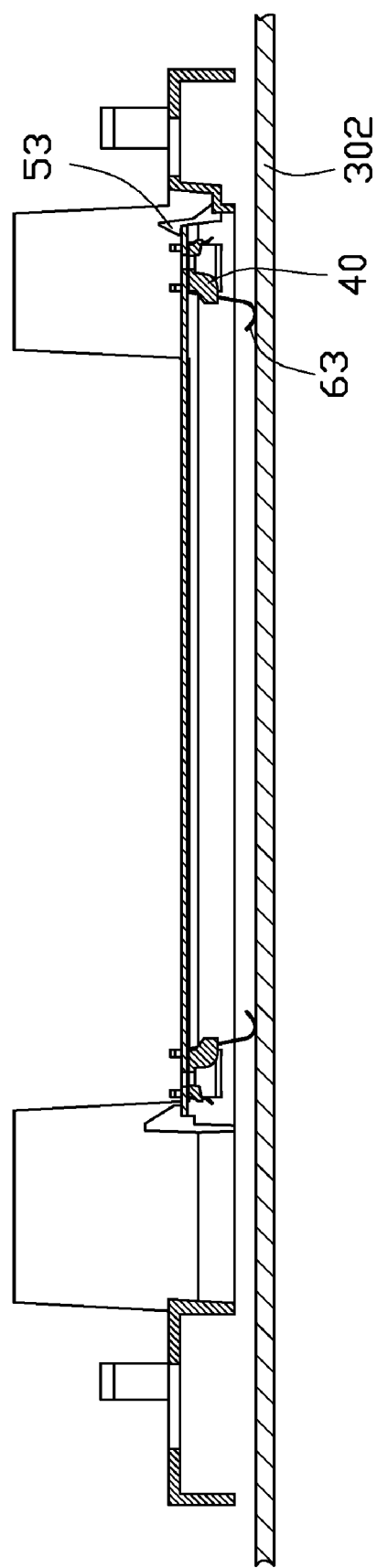
FIG. 8 is a cross-sectional view taken along line VII-VII of FIG. 1.

Referring to FIG. 8, in the embodiment, the printed circuit board 200 includes four conductive zones (not labeled) which are defined on the bottom surface of the four corners of the printed circuit board 200 respectively. The four conductive zones correspond to the four supporting members 40 respectively such that each of the elastic sheets 60 electrically contacts with a corresponding conductive zone. Therefore, the printed circuit board 200 is electrically connected to the housing 302 via the elastic sheet 60. Furthermore, the printed circuit board 200 may be secured in the retaining member 100 firmly as a spring force may be produced between the housing 302 and the printed circuit board 200 to prevent the printed circuit board 200 from being broken by impact during transportation.

A plurality of guiding members 70 protrude from the surface 430 of the connecting portion 43 and the third sidewall 14a respectively. In the embodiment, the guiding members 70 may be ribs extending upwardly. The guiding members 70 extend in a direction opposite to the direction the printed circuit board 200 being inserted into the retaining assembly 100 to protect the printed circuit board 200 from being inserted into the retaining assembly 100 in a wrong way.

Referring also to FIG. 1, to assemble the apparatus 300. Firstly, place the printed circuit board 200 on the retaining assembly 100, and the four corners of the printed circuit board 200 are in correspondence with the first and second retaining devices 30a and 30b respectively. Secondly, provide a force to press the printed circuit board 200 downward. The printed circuit board 200 presses the inclined surface 530 of the latching member 50, thus, the latching member 50 elastically deforms outward. As a result, the printed circuit board 200 is received in the space cooperatively defined by the clearances of the first and second retaining device 30a and 30b. After the printed circuit board 200 is received in the space, the latching member 50 rebounds as the protruding block 53 moves over and cooperates with the supporting portion 54 to secure the printed circuit board 200 with the four conductive zones of the printed circuit board 200 being electrically and mechanically contacted to the four supporting members 40 respectively. Thus, the printed circuit board 200 is retained to the retaining assembly 100 (see FIG. 8).

Furthermore, in some cases, because the elastic sheets 60 electrically contacts with the conductive zones of the housing 302, the static from the printed circuit board 200 is capable of being grounded.

To disassemble the printed circuit board 200, provide external force to press the recess 532 of the latching member 50 in a direction perpendicular to the third sidewall 14a, the latching member 50 elastically deforms, and the protruding block 53 moves over. As a result, the printed circuit board 200 is capable of being taken out from the retaining assembly 100.

Figure 9:
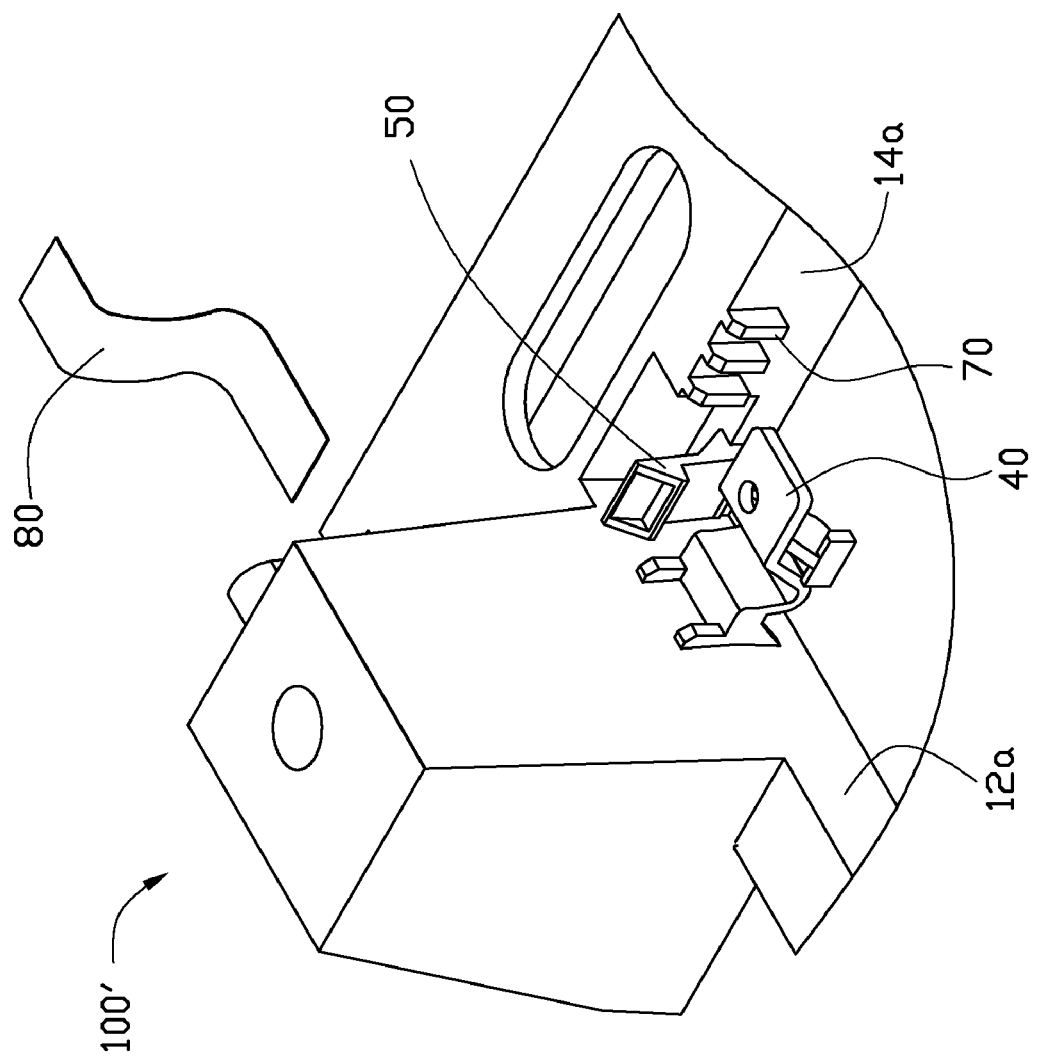
FIG. 9 is a perspective view of an apparatus in accordance with another embodiment.

Referring to FIG. 9, in another embodiment, the elastic sheet 60 can be replaced by a conductive element 80, such as a stick copper foil or an aluminum foil. One end of the conductive element 80 is bonded to the supporting portion 45 of the supporting member 40, and the other end is attached to the housing 302. Thus, after the printed circuit board 200 is retained in the retaining assembly 100, the printed circuit board 200 is electrically connected to the housing 302 via the conductive elements 80 electrically contacting with the conductive zones of the printed circuit board 200.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A retaining assembly, for retaining a first member with a second member, the retaining assembly comprising:
a body mounted to the first member; and
at least one retaining device disposed on the body;
wherein the at least one retaining device comprises a supporting member and a latching member corresponding to the supporting member, the supporting member and the latching member cooperatively define a space for receiving the second member, and cooperatively secure the second member in the space, the supporting member comprises a connecting portion, a supporting portion, and a curved portion, the connecting portion is fixed to the body, and the supporting portion is coupled to the connecting portion via the curved portion.

2. The retaining assembly of claim 1, wherein the first member is a housing of an electronic device, and the second member is a printed circuit board.

3. The retaining assembly of claim 1, wherein the latching member of the at least one retaining device is capable of being driven to elastically deform to move over for retaining the second member.

4. The retaining assembly of claim 3, wherein the latching member comprises a retaining block, and a protruding block projecting from an end of the retaining block along a direction from the latching member to the supporting member.

5. The retaining assembly of claim 4, wherein the protruding block is located above the supporting member such that the space for receiving the second member is defined by the bottom surface of the protruding block and the top surface of the supporting member.

6. The retaining assembly of claim 5, wherein the protruding block defines an inclined surface for guiding the second member.

7. The retaining assembly of claim 1, further comprising at least one conductive element, opposite ends of the at least one conductive element are electrically connected to the supporting portion and the first member to allow the second member to be electrically connected to the first member when the second member is retained in the retaining assembly.

8. The retaining assembly of claim 7, wherein the second member comprising at least one conductive zone, the conductive element electrically contacts with the conductive zone when the second member is retained in the retaining assembly.

9. The retaining assembly of claim 8, wherein the conductive element comprises a top portion, a contacting portion, and a positioning portion, the contacting portion and the positioning portion protrude from opposite ends of the top portion, and are arranged in the same side of the top portion.

10. The retaining assembly of claim 7, wherein a restricting portion is fixed to the supporting portion, and a protrusion protrudes from the supporting portion opposite to the restricting portion, the restricting portion cooperates with the protrusion to retain the at least one conductive element to the supporting portion.

11. An apparatus, comprising:
a first member;
a second member;
a retaining assembly disposed on the first member, the retaining assembly comprising a body and at least one retaining device mounted on the body, the retaining device comprising a supporting member and a latching member corresponding to the supporting member, the supporting member and the latching member cooperatively defining a space; and
at least one conductive element, wherein opposite ends of the at least one conductive element are electrically connected to the supporting member and the first member respectively so as to allow the second member to be electrically connected to the first member when the second member is retained in the retaining assembly; each conductive element comprises a top portion, a contacting portion, and a positioning portion, the contacting portion and the positioning portion protrude from opposite ends of the top portion, and are arranged in the same side of the top portion;
wherein the second member is received within the space, and is retained by the latching member cooperating with the supporting member.

12. The apparatus of claim 11, wherein the first member is a housing of a electronic device, and the second member is a printed circuit board.

13. The apparatus of claim 11, wherein the latching member of each retaining devices is capable of being driven to elastically deform to move over for retaining the second member.

14. The apparatus of claim 13, wherein the latching member comprises a retaining block, and a protruding block, the protruding block protrudes from an end of the retaining block, the protruding block faces, and is above at least a part of the supporting member.

15. The apparatus of claim 14, wherein the protruding block defines an inclined surface, the inclined surface is opposite to the supporting member.

16. The apparatus of claim 11, wherein the second member comprises at least one conductive zone, the conductive element electrically contacting the conductive zone when the second member is retained in the retaining assembly.

17. The apparatus of claim 16, wherein a restricting portion is fixed to the supporting member, and a protrusion protrudes from the supporting member opposite to the restricting portion, the restricting portion cooperating with the protrusion to retain the at least one conductive element to the supporting member.

18. The apparatus of claim 11, wherein the supporting member comprises a connecting portion, a supporting portion, and a curved portion, the connecting portion is fixed to the body, and the supporting portion is coupled to the connecting portion via the curved portion.

* * * * *